(12) United States Patent
Gäbler

(10) Patent No.: US 11,646,389 B2
(45) Date of Patent: May 9, 2023

(54) LOW DARK COUNT RATE SEMICONDUCTOR STRUCTURES

(71) Applicant: Daniel Gäbler, Apolda (DE)

(72) Inventor: Daniel Gäbler, Apolda (DE)

(73) Assignee: X-FAB Global Services GmbH, Erfurt (DE)

( * ) Notice: Subject to any disclaimer, the term of this patent is extended or adjusted under 35 U.S.C. 154(b) by 10 days.

(21) Appl. No.: 17/523,444

(22) Filed: Nov. 10, 2021

(65) Prior Publication Data
US 2022/0149222 A1     May 12, 2022

(30) Foreign Application Priority Data

Nov. 12, 2020 (GB) .................................... 2017847

(51) Int. Cl.
| | |
|---|---|
| H01L 31/103 | (2006.01) |
| H01L 31/107 | (2006.01) |
| H01L 29/06 | (2006.01) |
| H01L 31/18 | (2006.01) |
| H01L 31/109 | (2006.01) |

(52) U.S. Cl.
CPC ........ *H01L 31/107* (2013.01); *H01L 29/0646* (2013.01); *H01L 31/109* (2013.01); *H01L 31/1804* (2013.01)

(58) Field of Classification Search
CPC combination set(s) only.
See application file for complete search history.

(56) References Cited

U.S. PATENT DOCUMENTS

| | | | |
|---|---|---|---|
| 4,578,693 A | 3/1986 | Yazawa et al. | |
| 2013/0082286 A1* | 4/2013 | Finkelstein | ......... H01L 31/0336 257/E31.095 |
| 2018/0108799 A1* | 4/2018 | Stark | ................... H01L 31/1804 |
| 2021/0391489 A1* | 12/2021 | Levy | ............... H01L 31/035281 |

FOREIGN PATENT DOCUMENTS

| | | |
|---|---|---|
| EP | 0625803 A1 | 11/1994 |
| JP | S5673479 A | 6/1981 |

OTHER PUBLICATIONS

United Kingdom Intellectual Property Office, Combined Search and Examination Report Under Sections 17 and 18(3), Patent Application No. GB2017847.1, 6 pages, dated Apr. 13, 2021.

\* cited by examiner

*Primary Examiner* — Suberr L Chi
(74) *Attorney, Agent, or Firm* — Thompson Hine LLP

(57) ABSTRACT

A light sensitive semiconductor structure including a pn-junction in a silicon substrate. The pn-junction includes a central part and an edge part around surrounding the central part, the edge part being in contact with a surface of the silicon substrate. The structure further includes a plasma shielding structure covering at least a depletion width of the pn-junction over at least a part of the edge part where the edge part contacts the surface of the silicon substrate.

10 Claims, 2 Drawing Sheets

LOW DARK COUNT RATE SEMICONDUCTOR STRUCTURES

This application claims priority to UK Application No. 2017847.1 filed on Nov. 12, 2020 and entitled Low Dark Count Rate Semiconductor Structures, the entire contents of which are hereby incorporated by reference.

TECHNICAL FIELD

This disclosure relates low dark count rate semiconductor structures, for example for use in single photon avalanche diodes (SPADs).

BACKGROUND

For photodiodes, and in particular single photon detectors such as single photon avalanche diodes (SPADs) and avalanche photodiodes (APDs), a low dark count rate (DCR) is important for good performance, especially in low light settings. The DCR sets a limit to the lowest light intensity that can be reliably detected.

The DCR is a measure of the rate of detected events due to charge carriers that have not been excited by incoming light (typically thermally excited charge carriers), and can be determined by covering one or more photodiodes with a light shield to block all light incident on the photodiodes. Once the DCR is known, it can be subtracted from the output from the normal photodiodes. However, the light shield itself will affect the DCR and it is therefore difficult to determine the true DCR of the normal photodiodes. If the determined DCR is too high, the adjusted output from the photodiodes can go negative in low light settings.

Various solutions, both structural and in terms of signal processing, have been developed to lower the DCR or its effect on the output, but there is a constant need for further improvements in this field.

SUMMARY

This disclosure provides a light sensitive semiconductor structure as set out in the appended claims.

Certain embodiments will now be described with reference to the accompanying drawings.

DETAILED DESCRIPTION

One source of higher DCR is surface damages in the silicon from plasma processes during manufacturing. The most vulnerable parts of a SPAD or APD, regarding DCR, are the multiplication region and the depletion region around the pn-junction. Hence, the part of the pn-junction which comes closest to the silicon surface (i.e. the edge of the pn-junction) is critical to improving DCR. Metal and to some extent poly (polysilicon) on or over the silicon surface screens the high energetic particles of the plasma from the surface, but surface damage still occurs, which can increase the DCR.

Figure 1:
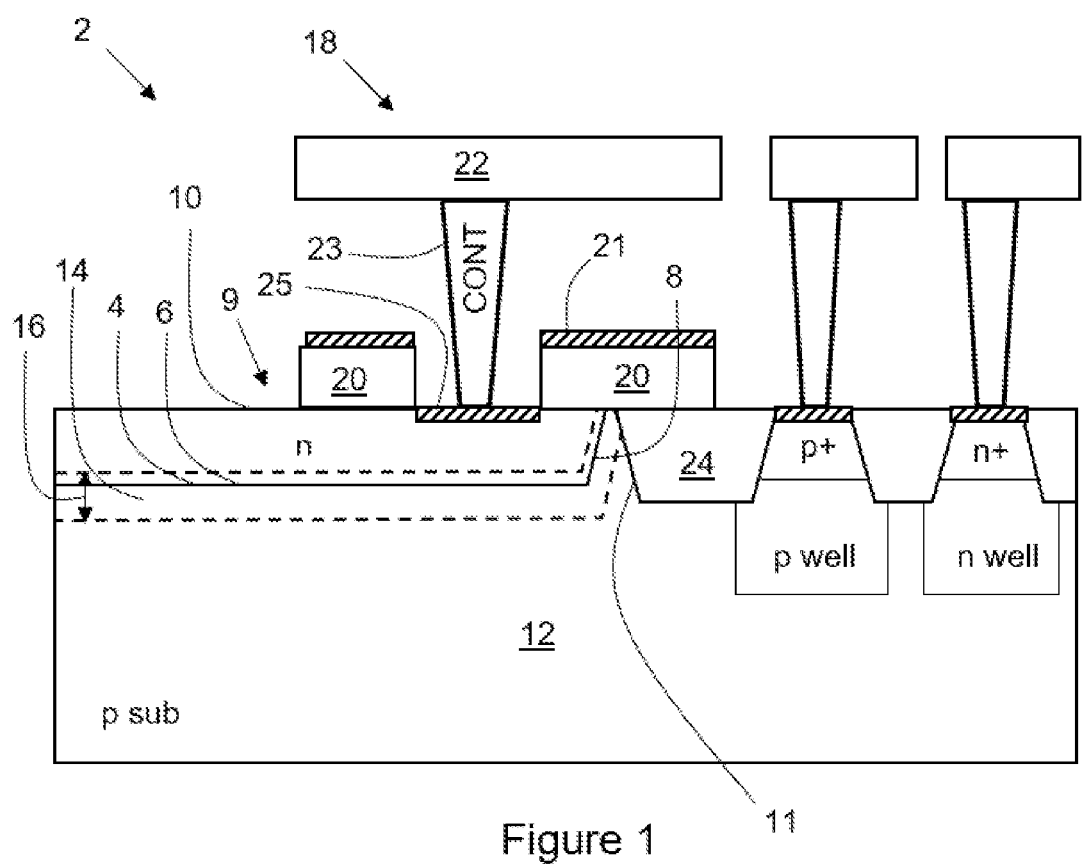
FIG. 1 shows a cross section of a semiconductor structure according to an embodiment.

FIG. 1 shows a schematic cross section of a part of a semiconductor structure 2 (e.g. being a semiconductor structure in a SPAD or APD). The semiconductor structure comprises a pn-junction 4 having a central part 6 and an edge 8 around the central part 6. The central part 6 of the pn-junction is typically rectangular (e.g. square), but may have another shape such as circular. The edge part 8 is the part of the junction 4 which runs from the central part 6 up towards the surface 9 of the silicon substrate 12. The silicon surface 9 comprises the top surface 10 (the uppermost horizontal silicon surface) of the silicon substrate 12, as well as the interface 11 between the silicon and any structures buried in the substrate 12. The edge part 8 is the part of the pn-junction 4 closest to the silicon top surface 10, and may therefore be most liable to plasma damage. The pn-junction 4 is surrounded by a depletion region 14, where no free charge carriers are present due to the inherent electric field across the junction 4. The depletion region 14 (inside dashed lines, not to scale) has a certain width 16 which extends across both sides of the pn-junction 4, and is in general not symmetric about the junction 4.

To protect the depletion region 14 close to the silicon top surface 10 from plasma damage, a plasma shielding structure 18 comprising polysilicon 20 (poly) and metal 22 is provided. The poly 20 is a salicided (i.e. self-aligned silicide) poly comprising silicide 21 (i.e. metal that has reacted with the poly 20). The metal 22 of the shielding structure is part of the first metal layer (Metal 1) of the backend stack of the semiconductor structure. Typically, the semiconductor structure 2 is a CMOS structure and the metal 22 is the first metal layer of the CMOS backend stack. The plasma shielding structure 18 covers the edge part 8 and depletion region 14. The semiconductor structure 2 also comprises a contact 23 (e.g. a metal via) and a self-aligned silicide region 25 for providing input/output via the metal 22.

The semiconductor structure further comprises shallow trench isolation 24 (STI), being a trench in the surface 9 filled with STI material (typically silicon oxide). The surface 9 of the silicon substrate 12 follows the outline of the STI 24 along an interface 11 between silicon 12 and STI 24.

Figure 2:
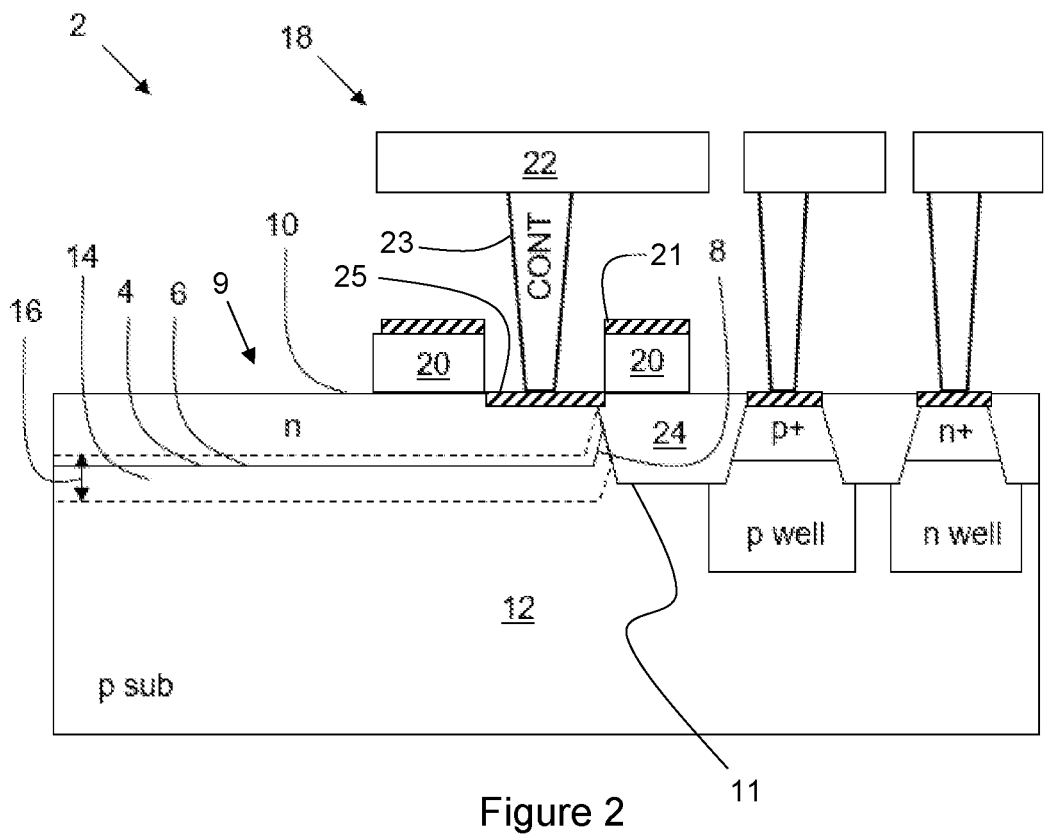
FIG. 2 shows a cross section of a semiconductor structure according to another embodiment, where the edge of the pn-junction is buried under STI.

FIG. 2 shows a schematic cross section of another embodiment of the semiconductor structure 2. The same reference numerals are used for similar or equivalent features in different figures to aid understanding, and are not intended to limit the embodiments. In this embodiment, the STI 24 is arranged with respect to the pn-junction 4 so that the edge part 8 reaches the surface 9 at the interface 11 between the silicon substrate 12 and the STI 24. The pn-junction 6 reaches the interface 11 at a location below the STI 24. This further helps to protect the depletion region 14 around the edge part 8 at the surface 9 of the silicon substrate 12 from plasma damage, and thereby improves the DCR. A light sensor comprising this embodiment of the semiconductor structure 2 has been shown to have an improved DCR by one to two orders of magnitude.

Figure 3:
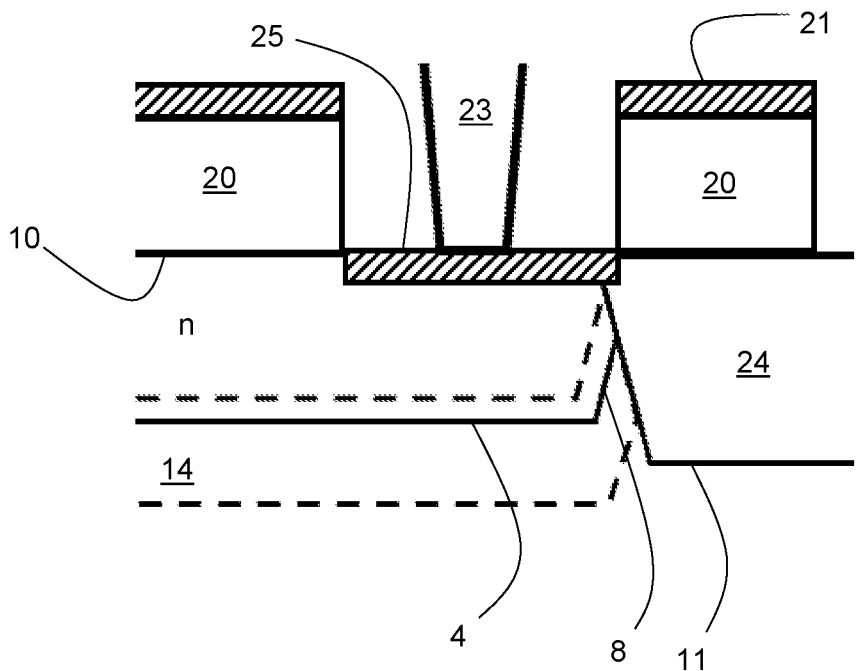
FIG. 3 shows an enlarged view of a part of FIG. 2.

FIG. 3 shows an enlarged view of a part of the structure of FIG. 2, focused on the edge 8 of the pn-junction 4, where it reaches the surface 9 at the interface 11 of the silicon substrate 12. The interface 11 (of the silicon substrate 12) follows the outline of the STI 24 trench.

The sooner a protection layer of the plasma shielding structure is provided in the manufacturing process sequence, the more plasma processes can be "blocked" by that layer. That is, the sooner an element of the shielding structure is provided in the manufacturing process, the more protection against plasma damage it can provide. Hence, a poly layer (e.g. poly 20 in FIG. 1 or 2) can offer more protection than a silicide (e.g. silicide 21 in FIG. 1 or 2), which is provided in a later process step. The metal layer (e.g. metal 22 in FIG. 1 or 2) is provided after both the poly and the silicide, and as such may offer less protection than the other two. Similarly, in some cases Metal 1 (the first metal layer in the backend stack) may be used instead of Metal 2 or higher, as these are provided later in the CMOS process sequence, allowing more plasma processes to occur before the protection structure is in place.

STI is provided relatively early in the manufacturing process, often before the implants are done, and as such can offer good/early protection against plasma damage when the pn-junction is arranged such that the edge is buried under the STI (see e.g. FIGS. 2 and 3).

In general, embodiments described herein provide a light sensitive semiconductor structure having a pn-junction in a silicon substrate with a plasma shielding structure located above the depletion region around the edge part of the pn-junction (i.e. where the pn-junction reaches the silicon surface. The plasma shielding structure may comprise at least one of polysilicon, salicided polysilicon, silicide, and metal (e.g. part of Metal 1 of a CMOS backend stack). For example, the shielding structure may be a combination of poly and metal, located over the edge part of the pn-junction. Beneficially, the whole edge part around the pn-junction is covered by the shielding structure, although some benefit may also be derived from a partial cover.

In addition, the structure may further comprise a dielectric structure, which the pn-junction reaches at the interface between the silicon substrate and the dielectric material. For example, the semiconductor structure may comprise shallow trench isolation (STI), which blocks the pn-junction. Hence, the edge of the pn-junction is buried beneath the STI, which further protects the depletion region from plasma.

Another embodiment is a light sensor, which comprises one or more the light sensitive semiconductor structures as described. For example, the light sensor may comprise an array of SPADs, wherein each SPAD comprises a light sensitive semiconductor structure as described.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A light sensitive semiconductor structure comprising:
a pn-junction in a silicon substrate, said pn-junction comprising a central part and an edge part surrounding said central part, said edge part being in contact with a surface of said silicon substrate, and wherein said surface of said silicon substrate comprises a trench, and wherein said edge part contacts said trench; and
a plasma shielding structure covering at least a depletion width of said pn-junction over at least a part of said edge part where said edge part contacts said surface of said silicon substrate.

2. The light sensitive semiconductor structure according to claim 1, wherein said plasma shielding structure comprises at least one of polysilicon, salicided polysilicon, silicide, and metal.

3. The light sensitive semiconductor structure according to claim 1, wherein said plasma shielding structure comprises metal, said metal being a part of a first metal layer, Metal 1, in a backend stack.

4. The light sensitive semiconductor structure according to claim 1, wherein said trench is filled with shallow trench isolation, STI, material.

5. The light sensitive semiconductor structure according to claim 4, wherein said edge part is buried under said STI.

6. The light sensitive semiconductor structure as claimed in claim 1, wherein said central part of said pn-junction is generally parallel with the surface of the silicon substrate above said pn-junction.

7. The light sensitive semiconductor structure as claimed in claim 1, wherein said edge part of said pn-junction extends upwards from said central part of said pn-junction towards said surface of said silicon substrate.

8. The light sensitive semiconductor structure as claimed in claim 7, wherein there is an angle of more than 90 degrees between the central and edge parts of the pn-junction.

9. A single photon avalanche diode, SPAD, comprising a light sensitive semiconductor structure according to claim 1.

10. A light sensor comprising an array of SPADs each being according to claim 9.

* * * * *